(12) United States Patent
Chien et al.

(10) Patent No.: US 11,201,123 B2
(45) Date of Patent: Dec. 14, 2021

(54) SUBSTRATE STRUCTURE AND MANUFACTURING METHOD THEREOF

(71) Applicant: Unimicron Technology Corp., Taoyuan (TW)

(72) Inventors: Chun-Hsien Chien, New Taipei (TW); Po-Chen Lin, Kaohsiung (TW); Wen-Liang Yeh, Hsinchu (TW); Chien-Chou Chen, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/673,967

(22) Filed: Nov. 5, 2019

(65) Prior Publication Data

US 2020/0194384 A1 Jun. 18, 2020

Related U.S. Application Data

(63) Continuation-in-part of application No. 16/283,670, filed on Feb. 22, 2019.

(30) Foreign Application Priority Data

Dec. 12, 2018 (TW) ................................ 107144688
Aug. 23, 2019 (TW) ................................ 108130141

(51) Int. Cl.
*H01L 23/15* (2006.01)
*H01L 23/00* (2006.01)
(Continued)

(52) U.S. Cl.
CPC .......... *H01L 23/562* (2013.01); *H01L 21/486* (2013.01); *H01L 23/15* (2013.01);
(Continued)

(58) Field of Classification Search
CPC ..................................................... H05K 5/069
(Continued)

(56) References Cited

U.S. PATENT DOCUMENTS 7,977,789 B2 7/2011 Park
8,404,587 B2 3/2013 Kirby et al.
(Continued)

FOREIGN PATENT DOCUMENTS

TW 201401343 1/2014

OTHER PUBLICATIONS

"Office Action of Taiwan Counterpart Application", dated May 13, 2020, p. 1-p. 8.

*Primary Examiner* — Stanley Tso
(74) *Attorney, Agent, or Firm* — JCIPRNET

(57) ABSTRACT

A substrate structure includes a glass substrate, a first circuit layer, a second circuit layer, and at least one conductive region. The glass substrate has a first surface and a second surface opposing the first surface. The first circuit layer is disposed on the first surface. The second circuit layer is disposed on the second surface. The conductive region includes a plurality of conductive micro vias. The conductive micro vias penetrate through the glass substrate. The conductive micro vias are electrically connected to the first circuit layer and the second circuit layer, and the conductive micro vias have a via size of 2 μm to 10 μm.

5 Claims, 4 Drawing Sheets

(51) Int. Cl.
*H01L 23/498* (2006.01)
*H01L 23/66* (2006.01)
*H01L 21/48* (2006.01)
*H01Q 1/24* (2006.01)

(52) U.S. Cl.
CPC .. *H01L 23/49827* (2013.01); *H01L 23/49838* (2013.01); *H01L 23/66* (2013.01); *H01L 2223/6677* (2013.01); *H01Q 1/241* (2013.01)

(58) Field of Classification Search
USPC .......................................................... 174/175
See application file for complete search history.

(56) References Cited

U.S. PATENT DOCUMENTS

| | | | | |
|---|---|---|---|---|
| 2013/0278568 | A1* | 10/2013 | Lasiter | H01L 27/12 |
| | | | | 345/204 |
| 2014/0239411 | A1* | 8/2014 | Brech | H01L 29/41766 |
| | | | | 257/394 |
| 2016/0093583 | A1* | 3/2016 | Yu | H01L 23/481 |
| | | | | 257/737 |

* cited by examiner

SUBSTRATE STRUCTURE AND MANUFACTURING METHOD THEREOF

CROSS-REFERENCE TO RELATED APPLICATION

This application is a continuation-in-part application of and claims the priority benefit of U.S. application Ser. No. 16/283,670, filed on Feb. 22, 2019, now pending. The prior U.S. application Ser. No. 16/283,670 claims the priority benefit of Taiwan application serial no. 107144688, filed on Dec. 12, 2018. This application also claims the priority benefit of Taiwan application serial no. 108130141, filed on Aug. 23, 2019. The entirety of each of the above-mentioned patent applications is hereby incorporated by reference herein and made a part of this specification.

BACKGROUND OF THE INVENTION

1. Field of the Invention

The present invention relates to a substrate structure and a manufacturing method thereof, and more particularly, to a substrate structure having conductive micro vias and a manufacturing method thereof.

2. Description of Related Art

Since a glass substrate has a highly flat surface, it is suitable for manufacturing of a redistribution layer (RDL) of fine line. However, forming through-glass via (TGV) in a glass substrate has following process difficulties: (1) TGV is high in manufacturing cost and requires two processes, laser and etching, and specialty chemicals with high harmfulness are used; and (2) Fine line often needs to be matched with TGV with a high aspect ratio (AR), but in a process of patterning the surface metal of a glass substrate with a high aspect ratio, pretreatments (such as roughening and surface property modification) taken for ensuring the conductive property of the copper metal in TGV to meet the requirement of a glass substrate is not contributive to the manufacturing of fine line on the surface of a glass substrate.

SUMMARY OF THE INVENTION

The present invention provides a substrate structure and a manufacturing method thereof, which utilize a plurality of conductive micro vias to replace a conventional conductive via and have the advantages of shortening manufacturing processes of conventional through-glass via (TGV), increasing the productivity, reducing the production cost, enhancing the mechanical properties of a substrate, and facilitating the subsequent manufacturing of a redistribution layer (RDL) of fine line.

The substrate structure of the present invention includes a glass substrate, a first circuit layer, a second circuit layer, and at least one conductive region. The glass substrate has a first surface and a second surface opposing the first surface. The first circuit layer is disposed on the first surface. The second circuit layer is disposed on the second surface. The conductive region includes a plurality of conductive micro vias. The conductive micro vias penetrate through the glass substrate. The conductive micro vias are electrically connected to the first circuit layer and the second circuit layer, and the conductive micro vias have a via size of 2 μm to 10 m.

In one embodiment of the present invention, a ratio of the total surface area of the conductive micro vias to the surface area of the conductive region is 10% to 80%.

In one embodiment of the present invention, a minimum spacing between the respective conductive micro vias is equal to the via size of the conductive micro vias.

In one embodiment of the present invention, an aspect ratio of the conductive micro vias is greater than 100.

In one embodiment of the present invention, a diameter of the conductive region is 45 μm to 100 μm.

In one embodiment of the present invention, a thickness of the glass substrate is 0.3 mm to 1.1 mm.

The manufacturing method of the substrate structure of the present invention includes the following steps: providing a glass substrate, wherein the glass substrate has a first surface and a second surface opposing the first surface; forming at least one conductive region, wherein the conductive region includes a plurality of conductive micro vias, and the conductive micro vias penetrate through the glass substrate, and a via size of the conductive micro vias is 2 μm to 10 μm; forming a first circuit layer on the first surface; and forming a second circuit layer on the second surface, wherein the conductive micro vias are electrically connected to the first circuit layer and the second circuit layer.

In one embodiment of the present invention, forming a plurality of conductive micro vias in the at least one conductive region includes: forming a plurality of micro vias in the conductive region, wherein the micro vias penetrate through the glass substrate, and a via size of the micro vias is 2 μm to 10 μm; and filling the micro vias with a conductive material.

In one embodiment of the present invention, the method for forming the micro vias is laser drilling, and no etching process is needed.

In one embodiment of the present invention, a minimum spacing between the respective micro vias is equal to the via size of the micro vias.

In one embodiment of the present invention, an aspect ratio of the micro vias is greater than 100.

Based on the above, the substrate structure and the manufacturing method thereof provided by the present invention can utilize the plurality of conductive micro vias to replace conventional conductive vias. The via size (2 μm to 10 μm) of the conductive micro vias is much less than that of the conventional conductive vias, and the micro vias may be directly formed by the laser drilling method without the extra etching process, so that the advantages of shortening the conventional TGV process, increasing the productivity, reducing the production cost, enhancing the mechanical properties of the substrate, and facilitating the subsequent manufacturing of the redistribution layer of fine line may be achieved.

In order to make the aforementioned and other objectives and advantages of the present invention comprehensible, embodiments accompanied with figures are described in detail below.

DESCRIPTION OF THE EMBODIMENTS

Embodiment 1

Figure 1A:
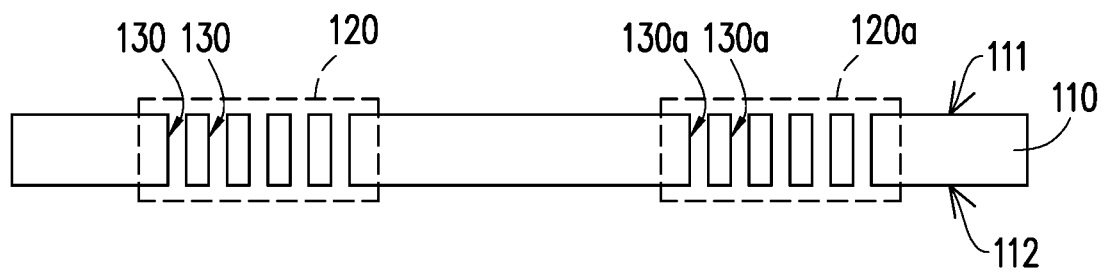
FIGS. 1A to 1C show cross-sectional schematic diagrams of a manufacturing method of a substrate structure according to Embodiment 1 of the present invention.
Figure 1B:
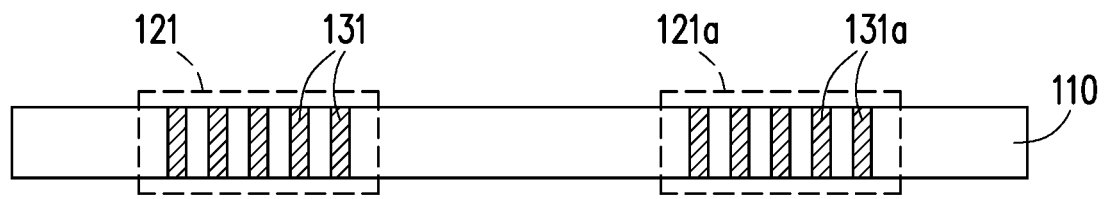
Figure 1C:
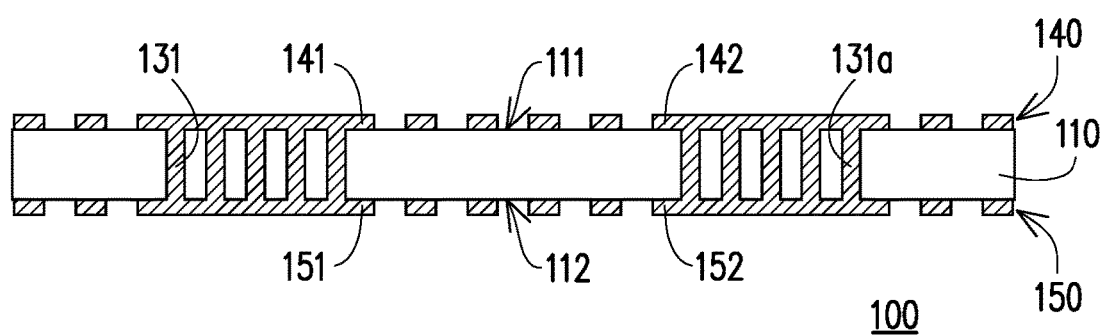
Figure 2:
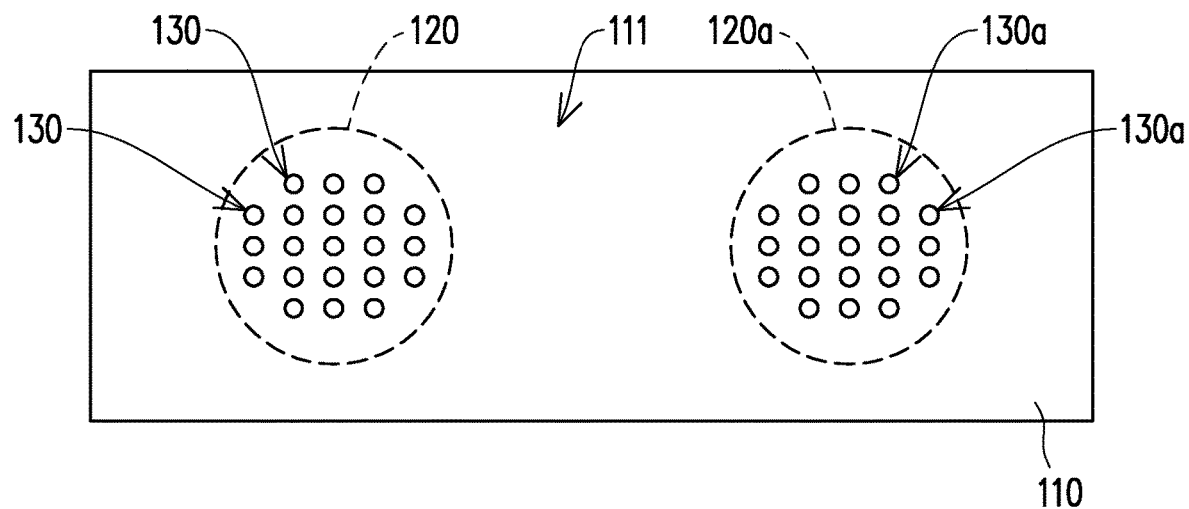
FIG. 2 shows a schematic top view of FIG. 1A.

FIGS. 1A to 1C show cross-sectional schematic diagrams of a manufacturing method of a substrate structure according to Embodiment 1 of the present invention. FIG. 2 shows a schematic top view of FIG. 1A.

Referring to FIGS. 1A and 2 at the same time, a glass substrate 110 is provided at first. The glass substrate 110 has a first surface 111 and a second surface 112 opposing the first surface 111. The thickness of the glass substrate 110 is, for example, 0.3 mm to 1.1 mm. Then, a plurality of micro vias 130, 130a are formed in the conductive region predetermined positions 120, 120a of the glass substrate 110 by a laser drilling method. The micro vias 130, 130a penetrate through the glass substrate 110 and communicate with the first surface 111 and the second surface 112 of the glass substrate 110. The via size of the micro vias 130, 130a is, for example, 2 μm to 10 μm. The aspect ratio of the micro vias 130, 130a is, for example, greater than 100. For example, when the thickness of the glass substrate 110 is 0.3 mm, the via size of the largest micro vias 130, 130a that may be matched is 3 μm; and when the thickness of the glass substrate 110 is 1.1 mm, the via size of the largest micro vias 130, 130a that may be matched is 10 μm.

Specifically, the shape of the conductive region predetermined positions 120, 120a on the first surface 111 (or the second surface 112) is, for example, circular or elliptical, but are not limited thereto. The diameter of the conductive region predetermined positions 120, 120a on the first surface 111 (or the second surface 112) is, for example, 45 μm to 100 μm. In addition, the micro vias 130, 130a in the conductive region predetermined positions 120, 120a are arranged, for example, in an arraying manner at the conductive region predetermined positions 120, 120a. Therefore, a spacing between the micro vias 130, 130a is equal, but is not limited thereto. That is, in other embodiments, the spacing between the micro vias 130, 130a may be also different, as long as the spacing is greater than or equal to the via size of the micro vias 130, 130a to stabilize the structures of the micro vias 130, 130a. Further, in some embodiments, the minimum spacing between the respective micro vias 130 (or 130a) may be equal to the via size of the micro vias 130 (or 130a). That is, the minimum distance between the edge of one of the micro vias 130 (or 130a) and the edge of the adjacent micro via 130 (or 130a) may be equal to the via size of the micro via 130 (or 130a). For example, when the via size of the plurality of micro vias 130 in the conductive region predetermined position 120 is 5 μm, the minimum distance between the edge of one of the micro vias 130 and the edge of the adjacent micro via 130 is 5 μm.

Next, referring to FIG. 1B, the micro vias 130, 130a are filled with a conductive material to form the conductive micro vias 131, 131a and the conductive regions 121, 121a. The conductive material may be formed by a plating process such as electroless plating. The conductive material may be a metal or metal alloy such as copper, titanium, tungsten, aluminum, or the like, or a combination thereof. Therefore, in the present embodiment, the plurality of conductive micro vias 131, 131a are disposed in the conductive regions 121, 121a, and the conductive micro vias 131, 131a penetrate through the glass substrate 110, and the via size of the conductive micro vias 131, 131a is 2 μm to 10 μm.

Specifically, the diameter of the conductive regions 121, 121a on the first surface 111 (or the second surface 112) is, for example, 45 μm to 100 μm. The minimum spacing between the respective conductive micro vias 131 (or 131a) is equal to the via size of the conductive micro vias 131 (or 131a). Therefore, the minimum distance between the edge of one of the conductive micro vias 131 (or 131a) and the edge of the adjacent conductive micro via 131 (or 131a) is equal to 2 μm to 10 μm. In addition, a ratio of the total surface area of all the conductive micro vias 131 (or 131a) in each conductive region 121 (or 121a) to the surface area of the conductive region 121 (or 121a) on the first surface 111 or the second surface 112 is 10% to 80% for higher conductivity.

Then, referring to FIG. 1C, a first circuit layer 140 is formed on the first surface 111 of the glass substrate 110, and a second circuit layer 150 is formed on the second surface 112 of the glass substrate 110, for example in an electroplating way. The conductive micro vias 131, 131a are electrically connected to the first circuit layer 140 and the second circuit layer 150. In the present embodiment, the first circuit layer 140 is in direct contact with the glass substrate 110, and the second circuit layer 150 is in direct contact with the glass substrate 110. In some embodiments, the first circuit layer 140 includes a plurality of connection pads 141, 142. The second circuit layer 150 includes a plurality of connection pads 151, 152. The connection pads 141 are disposed corresponding to the connection pads 151, and the connection pads 141 are electrically connected to the connection pads 151 through the conductive micro vias 131. The connection pads 142 are disposed corresponding to the connection pads 152, and the connection pads 142 are electrically connected to the connection pads 152 through the conductive micro vias 131a. At this time, a substrate structure 100 of Embodiment 1 has been manufactured.

In short, the substrate structure 100 of the present embodiment includes the glass substrate 110, the first circuit layer 140, the second circuit layer 150, and at least one conductive region 121, 121a. The glass substrate 110 has the first surface 111 and the second surface 112 opposing the first surface 111. The first circuit layer 140 is disposed on the first surface 111. The second circuit layer 150 is disposed on the second surface 112. The conductive region 121, 121a includes the plurality of conductive micro vias 131, 131a. The conductive micro vias 131, 131a penetrate through the glass substrate 110, and are electrically connected to the first circuit layer 140 and the second circuit layer 150. The via size of the conductive micro vias 131, 131a is 2 μm to 10 μm. In addition, since the via size of the micro vias 130 (or 130a) is small, the micro vias may be directly formed by a laser drilling method without an extra etching process, so that a through-glass via (TGV) process may be shortened, the productivity is increased, the production cost is reduced, the mechanical properties of the substrate are enhanced, and the subsequent manufacturing of a redistribution layer (RDL) of fine line may be facilitated.

Comparative Example 1

Figure 3A:
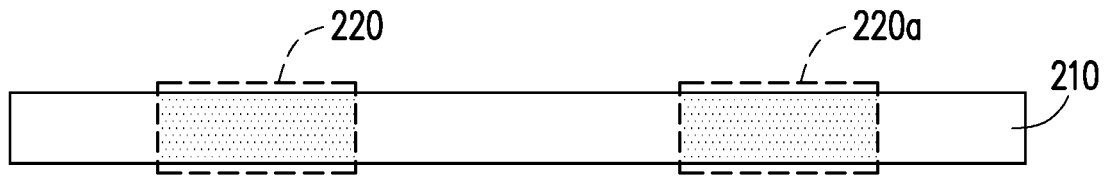
FIGS. 3A to 3C show cross-sectional schematic diagrams of a manufacturing method of a substrate structure according to a Comparative Example 1.
Figure 3B:
Figure 3C:
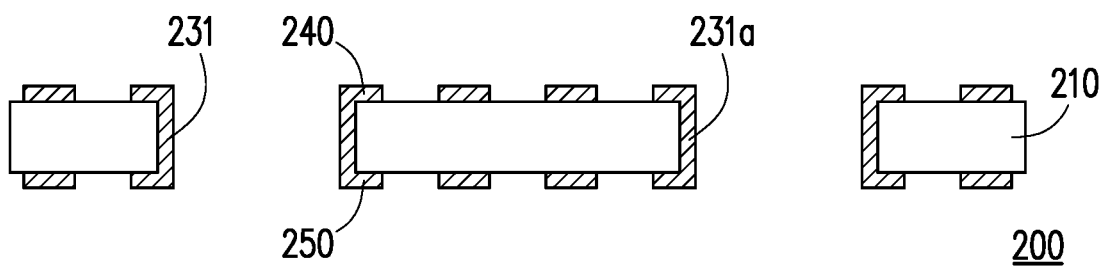
Figure 4:
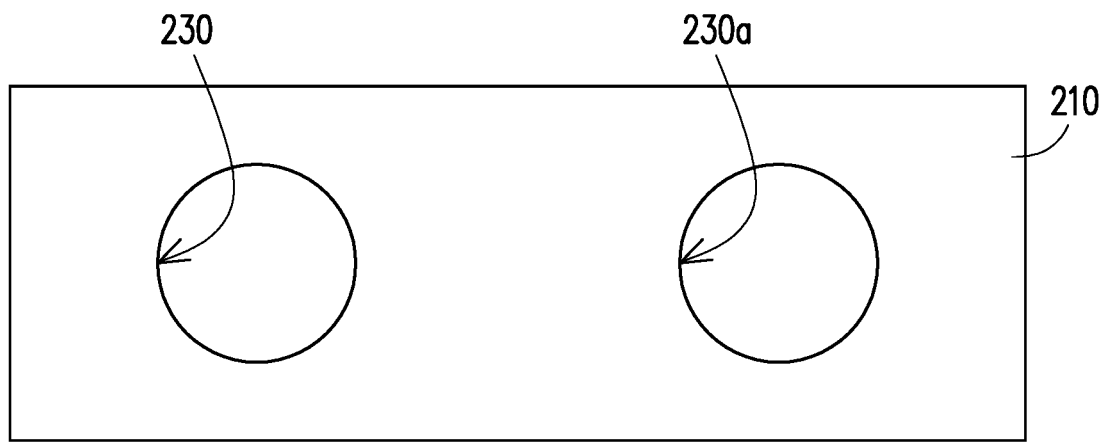
FIG. 4 shows a schematic top view of FIG. 3B.

FIGS. 3A to 3C show cross-sectional schematic diagrams of a manufacturing method of a substrate structure according to a Comparative Example 1. FIG. 4 shows a schematic top view of FIG. 3B.

Referring to FIGS. 3A to 3B, conventional steps of manufacturing a through-glass via (TGV) are illustrated. Firstly, TGV predetermined positions 220, 220a in a glass substrate 210 are modified by a laser method. Then, the glass substrate 210 in the TGV predetermined positions 220, 220a is removed by an etching process, so as to form TGVs 230, 230a. The etching process is, for example, to remove modified glass by using hydrofluoric acid or other suitable glass etching liquid. Here, the diameter of the TGV predetermined positions 220, 220a on the surface of the glass substrate 210 is equal to the via size of the TGVs 230, 230a, and is, for example, 45 μm to 100 μm.

Next, referring to FIG. 3C, a first circuit layer 240 and a second circuit layer 250 are respectively formed on the surfaces of two sides of the glass substrate 210, for example in an electroplating way, and conductive layers are formed in the walls of the TGVs 230, 230a, so as to form conductive vias 231, 231a. The via size of the conductive vias 231, 231a is 45 μm to 100 μm. At this time, a substrate structure 200 of the Comparative Example 1 has been manufactured.

Comparison of Embodiment 1 and Comparative Example 1

Referring to FIGS. 1A to 1C, 2, 3A to 3C and 4 at the same time, firstly, it can be known that the conductive regions 121, 121a of Embodiment 1 are the same as the TGVs 230, 230a of the Comparative Example 1 in size. For example: the diameter of the conductive region predetermined positions 120, 120a of Embodiment 1 on the first surface 111 (or the second surface 112) and the via size of the TGVs 230, 230a of the Comparative Example 1 are both 45 μm to 100 μm. Two sides of the glass substrate 110 of Embodiment 1 are respectively provided with the first circuit layer 140 and the second circuit layer 150, and two sides of the glass substrate 210 of the Comparative Example 1 are also respectively provided with the first circuit layer 240 and the second circuit layer 250.

However, a main difference between Embodiment 1 and Comparative Example 1 is that: compared with Comparative Example 1, in which a single conductive via 231 (or conductive via 231a) is electrically connected to the first circuit layer 240 and the second circuit layer 250, Embodiment 1 is that a plurality of conductive micro vias 131 (or conductive micro vias 131a) are provided to replace the single conductive via 231 (conductive via 231a) of Comparative Example 1 in the conductive region 121 (or conductive region 121a) which is the same as the conductive via 231 (or conductive via 231a) of Comparative Example 1 in size, and are used to electrically connect to the first circuit layer 140 and the second circuit layer 150. That is, in a unit area, Embodiment 1 utilizes the plurality of conductive micro vias 131 (or conductive micro vias 131a) to replace the single conductive via 231 (or conductive via 231a) of Comparative Example 1, so as to electrically connect to the first circuit layer 140 and the second circuit layer 150. The via size of the conductive micro vias 131, 131a of Embodiment 1 is 2 μm to 10 μm, but the via size of the conductive vias 231, 231a of Comparative Example 1 is 45 μm to 100 μm.

In addition, the via size of the conductive micro vias 131, 131a of Embodiment 1 is much less than that of the conductive vias 231, 231a of Comparative Example 1, so that compared with Comparative Example 1, in which the TGVs 230, 230a need to be formed by the laser modification and etching processes, in Embodiment 1, that the plurality of micro vias 130, 130a may be directly manufactured by only using the laser drilling method without the extra etching process. Further, due to the way of Embodiment 1 that the plurality of micro vias 130, 130a replace the single TGVs 230, 230a, Embodiment 1 has the advantages of shortening the TGV process, increasing the productivity and reducing the production cost.

Next, compared with the method of forming the conductive vias 231, 231a in Comparative Example 1, in Embodiment 1, the conductive micro vias 131, 131a may be formed by metalizing the micro vias 130, 130a with a chemical wet process, such as electroless plating method. Meanwhile, the chemical wet process may not be limited by the high aspect ratio of the micro vias 130, 130a, and may ensure that the metals in the micro vias 130, 130a are all conducted. In addition, the micro vias 130, 130a of Embodiment 1 may not affect the subsequent manufacturing of the RDL of fine line on the surface of the glass substrate 110, so that the difficulty of the subsequent electroplating process may be substantially lowered.

It is worthy of mentioning that the substrate structure of the present embodiment implements the conductive micro vias in the glass substrate, so that the glass substrate has relatively good mechanical properties, and the substrate structure of the present embodiment is further enabled to have relatively high flatness and is suitable for manufacturing of the RDL of fine line, and even may be applied to one portion of a 5th-generation (5G) antenna design.

Based on the above, the substrate structure and the manufacturing method thereof provided by the present invention can utilize the plurality of conductive micro vias to replace conventional conductive vias. The via size (2 μm to 10 μm) of the conductive micro vias is much less than that of the conductive vias, and the micro vias may be directly formed by the laser drilling method without the extra etching process, so that the advantages of shortening the conventional TGV process, increasing the productivity, reducing the production cost, enhancing the mechanical properties of the substrate and facilitating the subsequent manufacturing of the RDL of fine line may be achieved.

Although the present invention is described with reference to the above embodiments, the embodiments are not intended to limit the present invention. A person of ordinary skill in the art may make variations and modifications without departing from the spirit and scope of the present invention. Therefore, the protection scope of the present invention should be subject to the appended claims.

What is claimed is:

1. A substrate structure, comprising:
a glass substrate, comprising a first surface and a second surface opposing the first surface;
a first circuit layer, disposed on the first surface and comprising a first pad;
a second circuit layer, disposed on the second surface and comprising a second pad; and
at least one conductive region, comprising a plurality of conductive micro vias, the first pad and the second pad,
wherein the plurality of conductive micro vias completely penetrate through the glass substrate and contact with the first pad and the second pad,
the plurality of conductive micro vias are electrically connected to the first circuit layer and the second circuit layer,
a via size of the plurality of conductive micro vias is 2 μm to 10 μm, and the plurality of conductive micro vias are only filled with a conductive material,
wherein the first circuit layer contacts the first surface of the glass substrate,
the second circuit layer contacts the second surface of the glass substrate, and the plurality of conductive micro vias are in direct connection with the first surface and the second surface of the glass substrate, wherein an aspect ratio of the plurality of conductive micro vias is greater than 100.

2. The substrate structure according to claim 1, wherein a ratio of a total surface area of the plurality of conductive micro vias to a surface area of the conductive region is 10% to 80%.

3. The substrate structure according to claim 1, wherein a minimum spacing between the respective conductive micro vias is equal to the via size of the plurality of conductive micro vias.

4. The substrate structure according to claim 1, wherein a diameter of the conductive region is 45 μm to 100 μm.

5. The substrate structure according to claim 1, wherein a thickness of the glass substrate is 0.3 mm to 1.1 mm.

* * * * *